July 9, 1968 TARO HORIBA ETAL 3,392,067

METHOD OF PRODUCING SILICON VARIABLE CAPACITANCE DIODES BY DIFFUSION

Filed June 29, 1966

United States Patent Office 3,392,067

Patented July 9, 1968

3,392,067

METHOD OF PRODUCING SILICON VARIABLE CAPACITANCE DIODES BY DIFFUSION

Taro Horiba, Kawasaki-shi, and Yoshio Nakajima, Tokyo, Japan, assignors to Fujitsu Limited, Kawasaki, Japan, a corporation of Japan Filed June 29, 1966, Ser. No. 561,499
Claims priority, application Japan, June 30, 1965, 40/39,493
3 Claims. (Cl. 148—186)

Our invention relates to a method of manufacturing silicon variable capacitance diodes of the hyper-abrupt junction type and more particularly to a production method based upon the double diffusion principle.

It is an object of the invention to devise a method which affords producing such capacitor diodes of improved uniformity of operational characteristics and which lends itself particularly well to quantity production.

The invention will be described with reference to the accompanying drawings in which.

Figure 1:
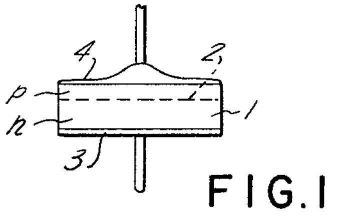
FIG. 1 shows schematically a p-n junction variable capacitance diode of the type produced by the method according to the invention.

As is schematically shown in FIG. 1, a variable capacitance p-n junction diode comprises a monocrystalline wafer 1 of semiconductor material which in case of the present invention consists of silicon. The wafer forms an abrupt p-n junction 2 between an acceptor-doped region and a donor-doped region. The respective n-type and p-type regions are contacted by electrodes 3 and 4.

In general, the capacitance C of a semiconductor p-n junction is a function of the impressed voltage V. The p-n junction may be produced by either the alloying technique or the diffusion technique for entering the dopant into the semiconductor wafer. In both cases, the relation between capacitance C and voltage V generally corresponds to the curve 21 in the diagram of FIG. 2, wherein the abscissa indicates impressed voltage and the ordinate indicates capacitance, both on logarithmic scales.

The present invention concerns itself only with diffusion doped capacitance diodes exhibiting a hyper-abrupt junction. The relation between capacitance and impressed voltage in a p-n junction having the dopant distribution required for a hyper-abrupt junction is typified by the curve 22 in FIG. 2. It will be recognized from curve 22 that the change of capacitance in relation to voltage is more effective than with the capacitance-voltage characteristic as represented by the curve 21.

Figure 2:
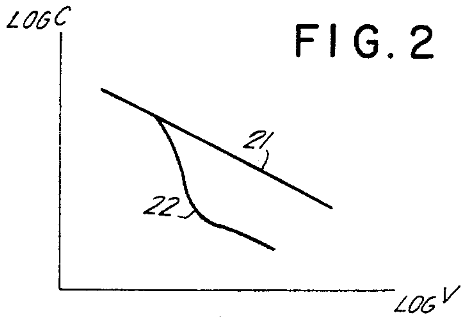
FIG. 2 is an explanatory graph relating to capacitor diodes in general.
Figure 3:
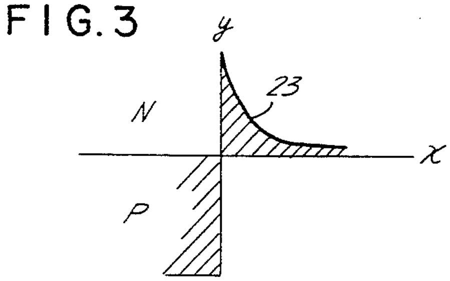
FIGS. 3 to 7 are explanatory graphs relating to hyper-abrupt junction diodes made according to the invention.

The dopant or impurity distribution required for a hyper-abrupt characteristic as exemplified by curve 22 in FIG. 2 is schematically exemplified by the graph shown in FIG. 3 in which the $x$-axis (abscissa) indicates distance from the p-n junction plane and the $y$-axis (ordinate) indicates dopant concentration (density). A p-n junction variable capacitance diode having an impurity distribution similar to that represented by curve 23 in FIG. 3 is called a variable capacitance diode of the hyper-abrupt type.

As a rule, it is desirable to produce variable capacitance diodes in such a manner that they exhibit a substantially uniform capacitance-voltage characteristic. While this can be readily achieved with ordinary diffusion-type or alloy-type variable capacitance diodes having a characteristic of the kind corresponding to curve 21 in FIG. 2, it has been extremely difficult to provide for uniform capacitance-voltage characteristics in hyper-abrupt type variable capacitance diodes, due to the fact that they require a complicated impurity distribution as exemplified in FIG. 3.

Figure 4:
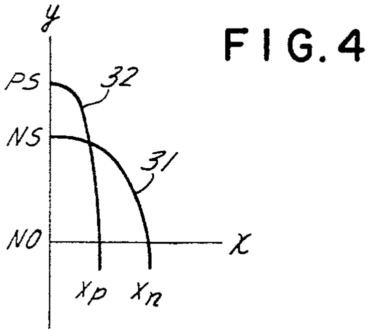

Such an impurity distribution can be realized by the double diffusion method, namely by diffusing donor dopant and acceptor dopant from the same face into the semiconductor crystal in the manner apparent from the diagram shown in FIG. 4 in which the $x$-axis indicates distance from the crystal surface and the $y$-axis indicates dopant concentration (density) both on a logarithmic scale. The example represented by FIG. 4 relates to diffusion of a donor from the surface into an n-type semiconductor substrate having an impurity distribution density NO. This first diffusion step corresponds to the curve 31. It causes diffusion of the donor down to the depth $X_n$ and produces an n-type region whose surface density has the value NS. The second diffusion step is performed by diffusing acceptor dopant from the same surface into the crystal down to a depth $X_p$ in accordance with curve 32, resulting in an acceptor surface density of PS.

Figure 5:
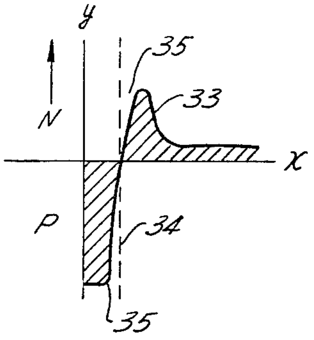

The resulting effective impurity distribution is exemplified by FIG. 5 in which the $x$-axis indicates distance from the crystal surface, the $y$-axis denotes impurity concentration, and the broken line 34 parallel to the surface indicates the resulting hyper-abrupt p-n junction.

A hyper-abrupt type impurity distribtion can also be obtained by exchanging donors for acceptors in the above-described process. However, it is preferable to employ the above-mentioned sequence of diffusion steps because experience has shown that it results in better high-frequency characteristics of the diode. For that reason, the method according to the present invention requires first diffusing donor dopant into the silicon crystal and thereafter diffusing the acceptor dopant.

The distribution characteristic shown in FIG. 5 differs from the ideal hyper-abrupt distribution of FIG. 3 by the fact that it includes an impurity compensation region 35 at the junction 34. It is evident that, in theory, the impurity distribtion according to FIG. 5 can be realized by combining any donor and any acceptor dopants. However, from the viewpoint of electrical performance, a hyper-abrupt type variable capacitance diode must possess the following electrical characteristics:

(a) In the capacitance-voltage characteristic (FIG. 2) the effective change of capacitance must appear in the voltage range below 10 v.

(b) The breakdown voltage must be sufficiently larger than the just-mentioned voltage range.

(c) The capacitance voltage characteristic must be sufficiently uniform.

As a result, the required electrical characteristics determine the impurity distribution exemplified by FIG. 5. It follows therefrom that the parameters of FIG. 4 must have the following values:

(1) $NS=1$ to $8\times10^{17}$ cm.$^{-3}$; and this value must be maintained substantially uniform. If NS is below $1\times10^{17}$ cm.$^{-3}$, the effective change of capacitance is reduced, and if NS is above $8\times10^{17}$ cm.$^{-3}$, the requirement (b) cannot be reliably met.

(2) $X_n$ must be within several microns and must be substantially uniform.

(3) $PS\gg NS$, and uniformity must be preserved.

Another condition follows from the desire to have the highest possible voltage impressible upon the n-type region which determines the characteristic of the hyper-abrupt type variable capacitance diode. Hence:

(4) PS is made as large as feasible so that the impurity compensation layer 35 (FIG. 5) is minimized. PS must be above $1\times10^{19}$ cm.$^{-3}$ because if PS is below $1\times10^{19}$ cm.$^{-3}$, the compensation layer 35 becomes so large that the desired effective change of capacitance can no longer be expected.

It is possible in theory and has been confirmed by experiment that a hyper-abrupt impurity distribution satisfying the foregoing four requirements can be attained by any desired combination of either one of phosphorus, arsenic, antimony and bismuth as donor and either one of boron and gallium as acceptor. However, the capacitance-voltage characteristics of the diodes actually manufactured exhibit extreme divergencies and thus fail to meet the requirement for uniformity essential to mass production. For that reason, the known diodes of this type are not suited for industrial manufacture. There are many reasons for this failure, the most decisive one being the fact that it is usually extremely difficult to satisfy the requirement stated as item (1) above.

It is therefore a more specific object of the present invention to overcome these difficulties and to provide a method of manufacturing hyper-abrupt type variable capacitance diodes that exhibit uniform capacitance-voltage characteristics, aside from being also distinguished by other electrical characteristics desirable from electrical circuit viewpoints, while being well suited for large-scale production on an industrial scale. Another, more specific object of the invention is to provide a method of manufacturing, with the aid of the silicon double diffusion method, hyper-abrupt type variable capacitance diodes which satisfy the electrical characteristics mentioned above as items (a), (b) and (c) and thus meet the requirements of the above-mentioned items (1), (2), (3) and (4), and which, in addition, are suitable for industrial production and exhibit substantially uniform capacitance-voltage characteristics.

According to the invention, we produce a silicon variable capacitance diode of the hyper-abrupt junction type by first diffusing bismuth into a silicon wafer until the surface density reached is $1\times10^{17}$ to $8\times10^{17}$ bismuth atoms per cm.$^3$ thus forming an n-type region in the wafer. Thereafter we diffuse boron through the n-type region into the wafer until the surface density of the boron reaches a higher order of magnitude than the bismuth density, thus forming in the wafer a p-type region which together with the n-type region forms a hyper-abrupt junction. Such a silicon variable capacitance diode can be produced, for example, starting from an n-type ($1\times10^{15}$ cm.$^{-3}$ phosphorus doped) silicon body having a specific resistance of 5 ohm cm. Bismuth is indiffused for 60 minutes at 1100° C. This is performed by heating bismuth in a separate location to 1200° C. and the silicon wafer (body) to 1100° C. while using nitrogen as a carrier gas. As conclusion of the indiffusion the surface density (NS) is $2\times10^{17}$ cm.$^{-3}$ and the diffused layer is 1.2$\mu$. Boron is then diffused by a closed method for forty minutes at 950° C. for both the boron diffusing agent $B_2O_3$ and the silicon body. This produces a surface density (PS) of $2\times10^{20}$ cm.$^{-3}$ and a 0.3$\mu$ boron diffused layer.

It will be noted that it is essential to our invention to use as donor dopant the metal bismuth which heretofore has been scarcely used in the semiconductor industry. It has been confirmed as the result of many experiments that the NS value (FIG. 4) of a silicon crystal into which the metal bismuth has been diffused, can be made $2.0\times10^{17}$ cm.$^{-3}$ with excellent reproducibility. It is further essential that the second diffusion step be performed with boron which satisfies the requirements (3) and (4). That is, by using a metal, namely bismuth, for doping the n-type region and using boron for the p-type region, it becomes possible to manufacture by the silicon double diffusion method a hyper-abrupt variable capacitance diode which satisfies the electrical characteristics set forth above as items (a) and (b) and which also exhibits a uniform capacitance-voltage characteristic.

Figures 6, 7:
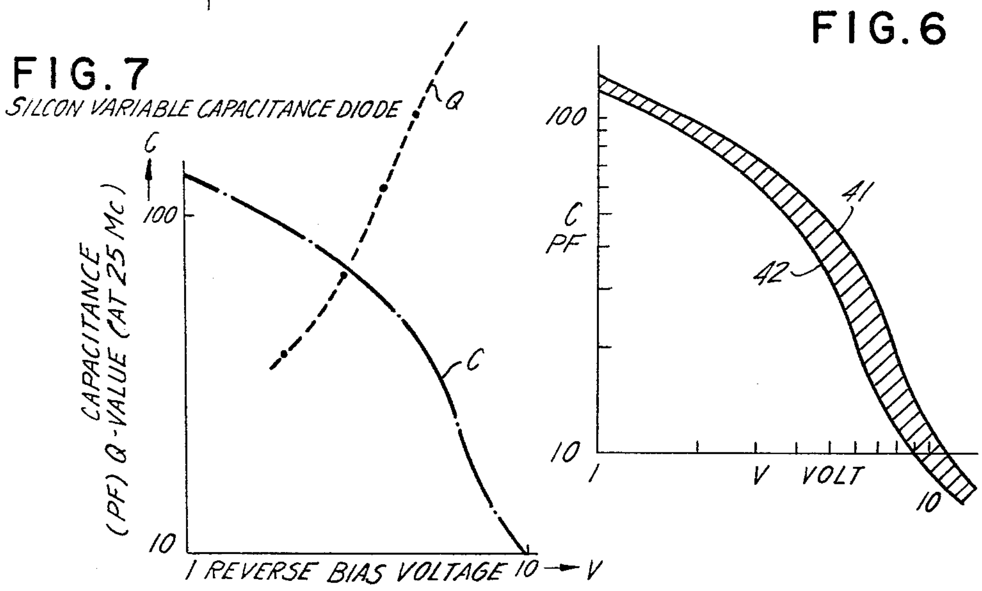

FIG. 6 shows capacitance-voltage characteristics of capacitors made according to the invention. The abscissa denotes voltage, the ordinate denotes capacitance. The curves 41 and 42 represent the most extreme characteristics measured. Various other characteristics were found to be located within the narrow limits of the two extreme curves. Such a narrow spread of the characteristics could not be obtained with hyper-abrupt capacitance diodes as heretofore known, nor with any other combinations of impurities. That is, the spread of the characteristics with such other combinations was so wide that they could not be accommodated within the coordinate diagram of FIG. 6.

FIG. 7 shows the capacitance-voltage characteristic of the capacitor made according to the specific illustration supra. FIG. 7 also shows the Q factor of such a capacitor. Q factor is defined as capacitance of a device divided by its resistance.

The improvement achieved by virtue of the invention may be ascribed to the fact that the bismuth and boron have the property of being saturated at the desired surface densitites when diffused into the silicon. This appears to explain physically the fact that the bismuth-boron combination exhibits a higher uniformity than the other combinations of impurities.

We claim:

1. The method of producing a silicon variable capacitance diode of the hyper-abrupt junction type, which comprises diffusing bismuth from one surface into a silicon wafer to a surface density of $1\times10^{17}$ to $8\times10^{17}$ bismuth atoms per cm.$^3$ to thereby form an n-type region, and thereafter diffusing boron from the same surface into the wafer to a surface density of a higher order of magnitude than said bismuth density to thereby form a p-type region.

2. The method according to claim 1, wherein boron is diffused into the wafer to a surface density above $1\times10^{19}$ atoms per cm.$^3$.

3. The method according to claim 1, wherein bismuth is diffused into the wafer to a surface density of about $2\times10^{17}$ atoms per cm.$^3$.

References Cited

UNITED STATES PATENTS 3,243,325 3/1966 Shinoda ........... 148—185
3,137,597 6/1964 Patalong ........... 148—185

HYLAND BIZOT, *Primary Examiner.*